United States Patent [19]

Difrancesco

[11] Patent Number: 5,670,251
[45] Date of Patent: Sep. 23, 1997

[54] PATTERNABLE PARTICLE FILLED ADHESIVE MATRIX FOR FORMING PATTERNED STRUCTURES BETWEEN JOINED SURFACES

[75] Inventor: Louis Difrancesco, Hayward, Calif.

[73] Assignee: Particle Interconnect Corporation, Colorado Springs, Colo.

[21] Appl. No.: 320,443

[22] Filed: Oct. 7, 1994

Related U.S. Application Data

[60] Continuation-in-part of Ser. No. 148,907, Nov. 8, 1993, Pat. No. 5,430,614, which is a division of Ser. No. 951,860, Sep. 28, 1992, Pat. No. 5,471,151, which is a continuation-in-part of Ser. No. 720,182, Jul. 22, 1991, abandoned, which is a division of Ser. No. 479,696, Feb. 14, 1990, Pat. No. 5,083,697.

[51] Int. Cl.$^6$ ............................................. B32B 5/16
[52] U.S. Cl. ................. 428/325; 428/328; 428/330; 428/331; 428/356
[58] Field of Search ......................... 428/325, 328, 428/330, 331, 344, 355, 356

[56] References Cited

U.S. PATENT DOCUMENTS

| | | | |
|---|---|---|---|
| 3,100,933 | 8/1963 | Hancock | 29/470.1 |
| 3,203,083 | 8/1965 | Obenhaus | 29/470.1 |
| 3,482,726 | 12/1969 | Schroeder | 220/2.3 |
| 3,555,664 | 1/1971 | Bingham | 29/470.1 |
| 3,632,319 | 1/1972 | Hoppin | 29/487 |

FOREIGN PATENT DOCUMENTS

| | | |
|---|---|---|
| 893469 | 12/1981 | U.S.S.R. |
| 1333511 | 8/1987 | U.S.S.R. |
| 1447611 | 12/1988 | U.S.S.R. |
| 2158757 | 11/1985 | United Kingdom |

*Primary Examiner*—Jenna Davis
*Attorney, Agent, or Firm*—Michael A. Glenn; Laurie J. Mintz

[57] ABSTRACT

A patternable bonding material for joining the surfaces of two or more substrates permits localization of conductive or insulating hard-cored particles within an adhesive matrix to form patterned structures on or between the surfaces. Electrical, thermal, or mechanical energy may be transferred through, or isolated by the material. The material may be used in an uncured state to allow easy separation of the joined surfaces, or a more permanent bond may be formed. The adhesive may be cured by thermocuring, evaporation or ablation of organic components, pressure, or by the application of ultraviolet radiation.

10 Claims, 1 Drawing Sheet

PATTERNABLE PARTICLE FILLED ADHESIVE MATRIX FOR FORMING PATTERNED STRUCTURES BETWEEN JOINED SURFACES

This application is a continuation-in-part of U.S. patent application Ser. No. 08/148,907, filed 8 Nov. 1993, now U.S. Pat. No. 5,430,614, which is a divisional application of U.S. patent application Ser. No. 07/951,860, filed 28 Sep. 1992, now U.S. Pat. No. 5,471,151 which is a continuation-in-part of U.S. patent application Ser. No. 07/720,182, filed 22 Jul. 1991; now abandoned, which is a division of U.S. patent application Ser. No. 07/479,696 (issued U.S. Pat. No. 5,083, 697), filed 14 Feb. 1990.

BACKGROUND OF THE INVENTION

1. TECHNICAL FIELD

The invention relates generally to the joining of at least two surfaces. More particularly, the invention relates to localizing electrical, thermal or mechanical communication within an adhesive material to form patterned structures between said surfaces.

2. DESCRIPTION OF THE PRIOR ART

Continuing advances in semiconductor fabrication techniques have allowed integrated circuit manufacturers to fabricate devices on semiconductor substrates that have submicron feature sizes. With the advent of bulk and surface micromachining technology, the electrical, thermal, and mechanical properties of materials, e.g. semiconductor materials such as silicon, are now readily exploited to maximum advantage in the manufacture of electrical, mechanical, and thermal systems. As device size is further reduced and performance is increased, the development of techniques that permit precision bonding of substrates, while maintaining electrical, mechanical, and/or thermal communication therebetween, becomes more critical.

The difficulties of precisely joining very many devices, such as semiconductors, while permitting electrical, mechanical, and/or thermal communication between the joined surfaces is well recognized in the art. For example, early attempts to provide precision electrical connectors alternated metal and plastic layers to form a laminated electrically conductive connector. See, for example Furuya, Material For Electric Contacts, U.S. Pat. No. 4,650,723 (17 Mar. 1987). Because of its relatively inflexible form, this connector does not provide the highest level of precision in the bonding of irregularly-shaped microchips and circuits, especially with such emerging technologies as those employing thin plastic film substrates and flexible circuit materials. The layering process also renders this approach less efficient for precision location of particular points of contact between two or more joined surfaces. Thus, it is not a practical method of localizing areas of varying electrical, mechanical, and/or thermal communication within the connection. Further, once a connection is formed using this approach, the joined surfaces are permanently bonded and cannot be easily separated without additional expense or damage to the surfaces. Thus, corrections, modifications, or reuse of parts is difficult.

The ability of certain metallic molecules to bond with each other when brought together has formed the basis of other prior art bonding methods. In one such embodiment, metallized particles having an outermost layer of aluminum are distributed over the surfaces of two or more substrates that are to be bonded. Upon compression of the substrates, the particles pierce the aluminum outer layer, forming diffusion bonds between the surfaces at those points where the virgin aluminum surfaces contact each other. A second related method uses compression to create regions of stress around these coated particles. The resulting elastoplastic deformation of the metal surfaces forms permanent or temporary diffusion bonds. See, for example L. DiFrancesco, Method For Cold Bonding, U.S. Pat. No. 4,804,132 (14 Feb. 1989); and L. DiFrancesco, Particle-Enhanced Joining of Metal Surfaces, U.S. Pat. No. 5,083, 697 (28 Jan. 1992). See, also I. Tsukagoshi, Y. Yamaguchi, A. Nakajima, Y. Goto, Composition For Circuit Connection Method, Method For Connection Using The Same, and Connected Structure of Semiconductor Chips, U.S. Pat. No. 5,001,542 (19 Mar. 1991).

However, these prior art methods may not be entirely well suited for bonding pressure sensitive substrates. Additionally, the application of pressure can create a sliding action, thereby affecting the precision and strength of the bond. As the location and depth of the particles is of critical importance, the use of such materials may result in increased cost for precision equipment, employee training, and quality control.

Application of pressure may cause shearing or deformation of the substrate. Elastic particles, such as those that are disclosed in Takeda, Heat Sensitive Type Adhesive Connector, U.S. Pat. No. 4,680,226 (14 Jul. 1987), deform in response to applied pressure. Thus, precise control of the critical spacing between the joined surfaces is not possible using this approach. Rigid particles do not present this concern, but when used in the context of a heat or pressure-cured adhesive, as described in Uehara, Method of Manufacturing Liquid Crystal Display Unit, U.S. Pat. No. 4,654, 965 (7 Apr. 1987), are subject to all of the deficiencies inherent to those processes. Furthermore, the bonded surfaces are not easily separated without damage to the two substrates.

Another prior art method for bonding two or more substrates at their surfaces involves the use of a hot-melt adhesive containing electroconductive particles. The adhesive is melted using direct application of heat, application of pressure, or through application of infrared radiation to an infrared-absorbing material in the adhesive. However, this approach produces microcracking of the substrate materials due to differences in the coefficients of thermal expansion between the substrates and the adhesive. Microcracking may also result from the extremely high temperatures that are required to melt the adhesives.

A one-part curing system for an adhesive containing electrically conductive particles is described in Su, Ultraviolet Curable Conductive Resin, U.S. Pat. No. 4,999,136 (12 Mar. 1991). The UV curable adhesive disclosed requires the incorporation of either metal particles, flakes, or powders, or metal-coated glass beads, glass flakes, or mica, and may be applied to a substrate by a silk screen printing process. The disclosure is limited to electroconductive metals and glass or mica cores, and is not applicable to thermal applications, or applications that require harder cores, such as industrial diamonds. The disclosed one-part curing system has a limited range of applications because the UV-cured adhesive may be used only in its hardened state, i.e. it cannot form a temporary bond. Therefore, the performance of an adhesive bond for electrical, thermal, or mechanical communication across the bond, i.e. across a temporary bond, cannot be tested or evaluated prior to actually curing the adhesive and forming a permanent bond.

The particle size of less than about 16 microns disclosed for the UV-curable adhesive was specifically designed to enhance the adhesive's electroconductive properties. However, so restricting the particle size is not advantageous in those applications where an electrically insulating adhesive is required, or where a thermoconductive or mechanical stress transfer adhesive is required.

It would be a significant advance in the art to provide an adhesive or resin material for bonding two or more substrates, where the material is easy to apply with precision, has excellent electroconductive, thermoconductive, or electro-mechanical bonding properties, is applicable to pressure and temperature sensitive substrates, and allows easy separation of the bonded substrates. It would be particularly useful to provide such a material that is readily patternable for selected, localized electrical, thermal, and/or mechanical communication across the bond.

SUMMARY OF THE INVENTION

The present invention provides an improved, easily applied, optionally curable adhesive, in which problems resulting from imprecise alignment, weak electroconductive bonding, and difficulty of separation are minimized, if not eliminated. The present invention can also be applied to pressure or temperature-sensitive substrates, and can be used to precisely localize areas of electrical conductivity or insulation, thermoconductivity or insulation, and/or transfer or spread mechanical stress within the bonding material.

In the preferred embodiment of the invention, a material is formed of hard-cored particles that are dispersed into an adhesive binder. The particles and/or binder may be electrically or thermally conductive or insulating, and/or may be adapted to spread or transfer mechanical stress, and to seal a bonded joint, or to space various substrates or members apart. In one embodiment of the invention, the material is applied with a photocopy machine onto a flexible substrate that is rolled onto the drum of the copier. In another embodiment of the invention, a photosensitive or lift-off stencil may then be used to pattern the material. The material may also be patterned by squirting, spraying, or by hand application. Patterning of adhesive compounds with varying properties is thus readily accomplished, for example through use of differently patterned stencils. The material may also be applied by a silk screening process.

The material may be retained in an uncured state, such that the substrates are easily separated, while those properties of a bonded material, i.e. the electrical, thermal, or mechanical properties of the bonded material, are retained. The preferred method for curing the material is a one or two-part process. In other embodiments of the invention, curing can be accomplished through thermocuring, exposure to UV radiation, the application of pressure, and/or the evaporation or ablation of organic components.

DETAILED DESCRIPTION OF THE INVENTION

The material of the present invention provides a unique and adaptable bonding material. By application of the teachings of the present invention, it is possible to produce optionally curable adhesives containing hard-cored particles of varying properties which may be easily localized within the adhesives, and which adhesives may be cured by differing means according to the requirements of the substrates to be bonded.

Figure 1:
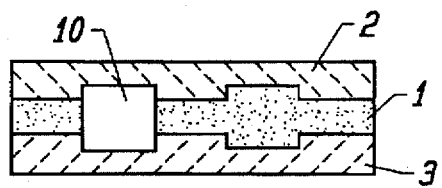
FIG. 1 is a sectional view illustrating a bond that is formed between two substrates using a material according to the present invention.

FIG. 1 is a sectional view illustrating a bond that is formed between two substrates using a conductive adhesive according to the present invention. As shown in the figure, two substrates 2,3 are bonded using an adhesive 1. When the adhesive is in its uncured state, the adhesive retains its electrical, thermal, or mechanical properties without forming a permanent bond between the surfaces of the two substrates, thus permitting easy detachment of the joined substrates. By facilitating the separability of the joined parts, modifications or repairs, corrections of mistakes in attachment, or reuse of components may be readily accomplished. The testing of components before determining whether to form a permanent bond is thus possible, thereby improving quality control procedures, achieving substantial financial savings, and avoiding the waste of materials and finished product.

The material includes an adhesive binder, such as Hysol 4510, Ablestick 967-1, Eastman 910, Loctite Stud Lock, and Norland 60 and 61 that can be cured to form a permanent bond after the material is applied to the surface of a substrate. The adhesive of the present invention offers the advantage of bonding substrates that require the use or avoidance of particular binding methods, such as the avoidance of pressure. The adhesive is preferably cured using a one or two-part process, for example a two-part 5-minute setting epoxy or a two-part underwater curing epoxy. Anaerobic curing conditions may be used to improve the electrical conductivity of the bond by preventing oxidation of the hard particles included in the material, for example by using Eastman 910 or Loctite Stud Lock. A thermoplastic gel binder, such as Elform thermoplastic adhesive may be used for those materials that tolerate variances in temperature, and a pressure sensitive binder gel, such as ultrahigh strength 3M pressure sensitive tape or 3M Post-It® low strength, pressure sensitive transfer tape may also be used to join components.

In another embodiment of the invention, an adhesive may be applied to a sensitive substrate that cannot tolerate application of heat or pressure, such as an integrated circuit, or a liquid crystal display. Organically-based binder gel, such as airplane glue, is applied to the substrate. The adhesive is then cured by ablation, dissolution, or volatilization of the organic carrier, leaving the substrates bonded by the cured adhesive.

Another embodiment of the invention provides an adhesive having a binder that may be cured by ultraviolet radiation, such as Norland 60 and 61. Ultraviolet curing is fast and it does not require the use of solvents that may otherwise damage sensitive substrate surfaces. The ability of the disclosed material to be used in either its uncured state, or after it is cured by a method specific to the particular needs of the application, makes the adhesive especially well suited for the automated surface-mounting of integrated circuits, as well as in the fabrication of microelectromechanical systems.

Figure 2:
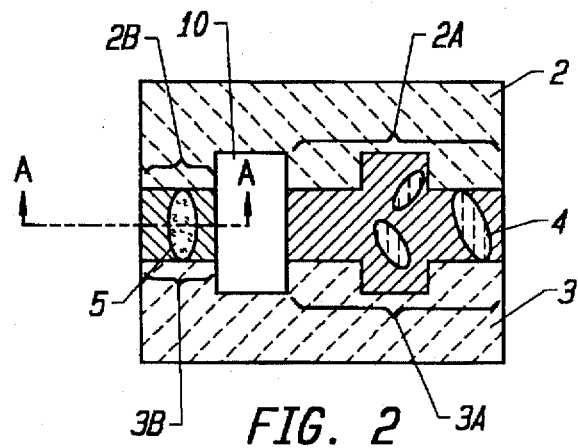
FIG. 2 is a sectional view illustrating the localization of varying properties within the bonding material according to the present invention.

FIG. 2 is a sectional view illustrating the localization of varying properties within the bonding material according to the present invention. In the figure, hard-cored particles 4 are incorporated in an adhesive binder 1 and join two substrates 2,3 at their respective zones of attachment 2a,3a. Hard-cored particles having selected electrical, thermal, or mechanical properties 5 dispersed in the adhesive binder 6 join the two substrates at additional zones of attachment 2b,3b. The size, shape, and composition of these hard-cored particles 4,5 can be varied according to the particular requirements of the substrate material, and may include the use of metal flakes or powder, or fibers. The size of the particles limits the maximum obtainable density.

The particles are composed of a material selected from the group consisting of silver, copper, titanium, gold, aluminum, platinum, nickel, tin, magnesium, lead, indium, steel or metal hard coated particles, and conductive hard particles, including silicon carbide, and mixtures and alloys thereof; and are preferably solid particles having an average size of about 6–200 µm, or flakes having an average size of 20–200 µm. Such particles are further described in L. DiFrancesco, Method For Cold Bonding, U.S. Pat. No. 4,804,132 (14 Feb. 1989); and L. DiFrancesco, Particle-Enhanced Joining of Metal Surfaces, U.S. Pat. No. 5,083,697 (28 Jan. 1992), which are incorporated herein by reference.

Figure 3:
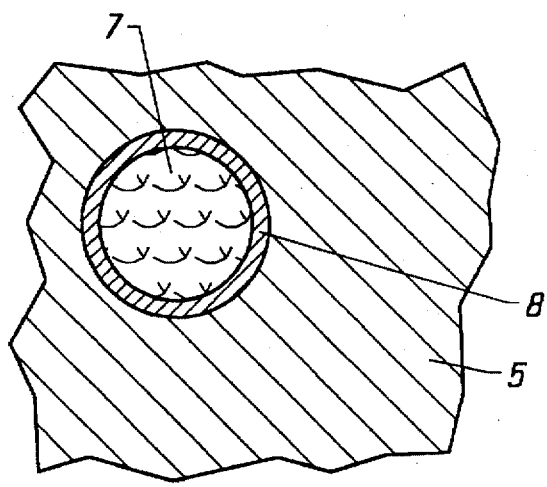
FIG. 3 is a sectional view of a metal-coated particle according to the present invention.

FIG. 3 is a sectional view of a metal-coated particle according to the present invention. In the figure, a particle is shown having a hard core 7, made of diamond or silicon carbide, and a metal coating 8, made of nickel. In those instances where increased electrical or thermal conductivity is required, the particles 7 should preferably consist of silver, copper, titanium, gold, aluminum, or platinum, or a combination or alloy of the above. Alternately, a carbon filled particle may be used. When insulating properties are required, a non-conductive core, such as alumina, quartz, or borosilicate may be used. Industrial diamond-core coated particles provide superior rigidity when mechanical stress is conducted or spread through the bond, and also provide superior thermal conductivity and superior electrical insulation. This flexibility with regard to particle size and composition allows for a broad range of uses for the adhesive disclosed. In an alternate embodiment, the binder material itself may provide electrical, thermal, or mechanical properties, for example the binder may be an anisotropic, electrically conductive adhesive.

Figure 4:
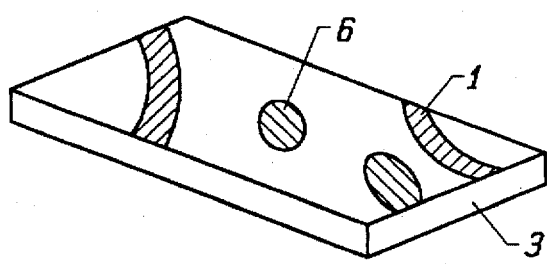
FIG. 4 is a perspective view illustrating a substrate that has been patterned using a xerographic technique to provide localized areas of communication across a bond between the surfaces of two or more substrates in accordance with the present invention.

FIG. 4 is a perspective view illustrating a substrate that has been patterned using a xerographic technique to provide localized areas of adhesive material having specified properties in accordance with the present invention. In the figure, two differently-propertied adhesives 1,6 are localized. Thus, the invention includes the patterning of material having different properties onto a common substrate. For example, both insulators and conductors may be patterned onto a substrate to form a plurality of conductive and insulating paths across a bond between two or more substrates. Furthermore, passive components, such as resistors and capacitors, may be formed by patterned application of the material. For example, to form a resistor, the size of the bonded area could determine the resistivity of the path between the two substrates that are bonded, or the density or composition of particles dispersed in the bonding material could be selected to exhibit a desired resistance.

A spaced structure is therefore defined comprising at least two parallel planar sheets; and spacers between said sheets for providing a predetermined separation therebetween, said spacers including a metal support and also including associated particles having a hardness greater than that of said metal; whereby a metal matrix support is formed between said sheets when said particles pierce a sheet surface. This structure may be used to form a capacitor, a battery, a fuel cell. Also, the spaced sheets may define a void 10 (see FIGS. 1 and 2) that provides a fluid transport path, wherein said fluid transport path includes a thermal transport medium.

In one embodiment of the present invention, the adhesive compound is loaded into the toner container of a standard photocopy machine. The photocopy machine patterns the adhesive material onto a flexible substrate sheet which is rolled onto the drum of the copier. This xerographic method of application offers the advantage of making the bonding process more accessible to potential consumers or users. Applicant incorporates herein by reference Applicant's pending U.S. patent application Ser. No. 07/951,860, having a filing date of 28 Sep. 1992. In particular but without limitation, Applicant incorporates herein the following text from said referenced patent application which forms the basis for this embodiment of the invention, as well as support for those claims contained herein that are directed thereto. With regard to these claims, Applicant relies on Applicant's previously submitted, copending patent application, as well as the filing date thereof.

In another embodiment of the invention, particle enhanced material can be applied by electrostatic techniques. That is, a pattern may be formed on a charged surface of an electrostatic device, much like the drum of a photocopy machine. The particle enhanced material is then picked up by the charged surface and transferred to a substrate, such as a circuit board.

Alternatively, an offset printing technique may be used where particle enhanced material is mixed with an ink resin or is provided in the form of an organo-metallic ink. The particle enhanced material is then patterned by standard printing techniques. It has been found that this embodiment of the invention, when practiced with roll or sheet substrate materials, provides exceptionally fast throughout. Standard printing speeds (typically 88 feet/second, i.e. 60 MPH) may be achieved by this technique.

In both the electrostatic and the offset printing embodiments of the invention a programmed image for patterning the particle enhanced material may be directed to the printer from a source file, thereby obviating the need for intermediate masks and the like. Resolution achieved by these techniques is on the order of 6—DPT—that is, a 2-mil resolution is achieved.

A photosensitive stencil or a lift-off stencil may alternatively be used to pattern the substrates. Additional embodiments of the invention provide for application of the adhesive in the form of a gel, a film, a sheet, or by a silk screening process, and also by spraying, squirting, hand application, or wiping.

Use of standard xerographic equipment or pre-cut stencils minimizes the need to incur further expenses for machinery to apply the material or for retooling of manufacturing operations. Further financial benefits can be expected as the preferred method for application of the adhesive of the present invention does not require special employee training.

Although the invention is described herein with reference to the preferred embodiment, one skilled in the art will readily appreciate that other applications may be substituted for those set forth herein without departing from the spirit and scope of the present invention. For example, the adhesive according to the invention may provide a mechanical bond that has a predetermined point at which the bond breaks as a result of mechanical stress; the material herein described may be applied over multiple connection sites between two substrates that are joined to reduce the density of conductive particles therebetween, and in fact, non-electrically-conductive particles may be used as herein described to space conductive members apart.

Additionally, the particles may be a semiconductor material, for example a doped particle, such that the material herein described provided an active region between two substrates. Such application may include a conducting region formed between two substrates that is contacted on either side by semiconducting particles that are also in contact with one or the other of the two conductive substrates, such that the conducting region, upon application of a suitable electrical current thereto, provides a gate for controlling conduction across the gap between the two substrates, and alternatively, for example if insulating particles are first applied to each of the substrates and then the two substrates are joined by an adhesive contained conductive particles, provides a ground plane that may be useful for shielding or electrostatic discharge control.

The material described herein may be used as a sealant to additionally provide a waterproof or hermetic joint having selected conductive properties. Thus, the adhesive material is useful to seal a gap between two substrate surfaces caused by interposition of the hard particles. Thus, although the particles are found useful to join the substrates, the inclusion of the particles in an adhesive matrix fills a gap between the substrates, while making it easier to apply the particles.

In this same vein, the use of an adhesive in conjunction with such hard particles provides a mechanism for maintaining registration of the particles to a selected site, while assisting in particle management and placement. The use of an adhesive further provides a carrier for the particles that allows particle placement by automated or semi-automated means, for example by spraying in a mixture that includes 10-40% particles by volume. The use of an adhesive also promotes an anaerobic environment that prevents oxidation of the particles. It is also contemplated that the selection of the adhesive will be made in accordance with the application in which the material herein described is used. Thus, an adhesive having a known quality of shrinkage during cure may be used to provide a compressive joint.

Accordingly, the invention should only be limited by the Claims included below.

I claim:

1. A joint between the surfaces of at least two substrates, having selected electrical properties, comprising:

an adhesive binder that is curable by a one or two-step process, said adhesive binder comprising one of a thermally conductive, thermally insulative, or electrically conductive material, or a material for spreading or concentrating mechanical stress, wherein said adhesive forms a temporary bond prior to curing and a permanent bond subsequent thereto;

a plurality of hard particles dispersed within said binder to form an adhesive matrix adapted to join said surfaces by selectably forming either of a temporary or permanent bond between the surfaces, the adhesive matrix being patterned by direct application upon at least one of said surfaces such that the particles within the adhesive matrix are brought into non-penetrating, non-bonding contact with said surfaces such that said matrix provides localized regions of communication between said surfaces across said bond, wherein said communication is primarily capacitive or resistive in nature, the value of which is determined by the size of the localized region and the constituent components of the material.

2. The joint of claim 1, wherein said particles are semiconductive.

3. The joint of claim 2, further comprising:

a diode.

4. A spaced structure, comprising:

at least two parallel planar sheets; and spacers between said sheets for providing a predetermined separation therebetween, said spacers including a metal support and also including an adhesive having associated particles having a hardness greater than that of said metal, said adhesive binder comprising one of a thermally conductive, thermally insulative, or electrically conductive material, or a material for spreading or concentrating mechanical stress, wherein said adhesive forms a temporary bond prior to curing and a permanent bond subsequent thereto;

whereby a metal matrix support is formed between said sheets when said particles pierce a sheet surface.

5. The structure of claim 4, wherein said structure is a capacitor.

6. The structure of claim 4, wherein said structure is a battery.

7. The structure of claim 4, wherein said structure is a fuel cell.

8. The structure of claim 4, wherein said spaced sheets define a void, said void providing a fluid transport path.

9. The structure of claim 4, wherein said fluid transport path includes a thermal transport medium.

10. A joint between the surfaces of at least two substrates having selected electrical properties, comprising:

an adhesive binder that is curable by a one or two-step process, said adhesive binder comprising one of a thermally conductive, thermally insulative, or electrically conductive material, or a material for spreading or concentrating mechanical stress, wherein said adhesive forms a temporary bond prior to curing and a permanent bond subsequent thereto;

a plurality of hard particles diepersed within said binder to form an adhesive matrix adapted to join said surfaces by selectably forming either of a temporary or permanent bond between the surfaces, the adhesive matrix being patterned on said surface such that the adhesive provides localized regions of communication between said surfaces across said bond, wherein said communication is primarily capacitive or resistive in nature, the value of which is determined by the size of the localized region and the constituent components of the material.

* * * * *